(12) United States Patent
Takeuchi et al.

(10) Patent No.: US 9,031,111 B2
(45) Date of Patent: May 12, 2015

(54) OPTICAL SEMICONDUCTOR DEVICE AND METHOD OF MANUFACTURING OPTICAL SEMICONDUCTOR DEVICE

(71) Applicant: Sumitomo Electric Device Innovations, Inc., Yokohama-shi, Kanagawa (JP)

(72) Inventors: Tatsuya Takeuchi, Yokohama (JP); Taro Hasegawa, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/310,490

(22) Filed: Jun. 20, 2014

(65) Prior Publication Data

US 2014/0302628 A1    Oct. 9, 2014

Related U.S. Application Data

(62) Division of application No. 13/094,117, filed on Apr. 26, 2011, now Pat. No. 8,798,110.

(30) Foreign Application Priority Data

Apr. 27, 2010  (JP) .................................. 2010-102729
Mar. 15, 2011  (JP) .................................. 2011-057014

(51) Int. Cl.
| | | |
|---|---|---|
| *H01S 5/00* | (2006.01) | |
| *H01S 5/20* | (2006.01) | |
| *H01S 5/22* | (2006.01) | |
| *H01S 5/227* | (2006.01) | |
| *H01S 5/30* | (2006.01) | |
| *H01L 21/02* | (2006.01) | |

(52) U.S. Cl.
CPC ................. *H01S 5/20* (2013.01); *H01S 5/2227* (2013.01); *H01S 5/2275* (2013.01);

(Continued)

(58) Field of Classification Search
CPC ............ H01S 5/18308; H01S 5/18344; H01S 5/18347; H01S 5/1835; H01S 5/22; H01S 5/2205; H01S 5/2226; H01S 5/223; H01S 5/227; H01S 5/2275; H01S 5/3072
USPC ............................................ 372/45.01, 46.01
See application file for complete search history.

(56) References Cited

U.S. PATENT DOCUMENTS

| | | |
|---|---|---|
| 5,717,707 A | 2/1998 | Beernink et al. |
| 6,414,976 B1 | 7/2002 | Hirata |

(Continued)

FOREIGN PATENT DOCUMENTS

| | | |
|---|---|---|
| JP | 05-226775 A | 9/1993 |
| JP | 07-131110 A | 5/1995 |

(Continued)

OTHER PUBLICATIONS

Japanese Notification of Reason(s) for Refusal dated Dec. 17, 2013, issued in corresponding Japanese application No. 2011-057014, w/ English translation (12 pages).

*Primary Examiner* — Yuanda Zhang
(74) *Attorney, Agent, or Firm* — Westerman, Hattori, Daniels & Adrian, LLP

(57) ABSTRACT

A method of manufacturing an optical semiconductor device including: forming a mesa structure including a first conductivity type cladding layer, an active layer and a second conductivity type cladding layer in this order on a first conductivity type semiconductor substrate, an upper most surface of the mesa structure being constituted of an upper face of the second conductivity type cladding layer; growing a first burying layer burying both sides of the mesa structure at higher position than the active layer; forming a depressed face by etching both edges of the upper face of the second conductivity type cladding layer; and growing a second burying layer of the first conductivity type on the depressed face of the second conductivity type cladding layer and the first burying layer.

11 Claims, 9 Drawing Sheets

(52) U.S. Cl.
CPC ........ *H01S 5/3013* (2013.01); *H01L 21/02392* (2013.01); *H01L 21/02461* (2013.01); *H01L 21/02543* (2013.01); *H01L 21/02576* (2013.01); *H01L 21/02579* (2013.01); *H01L 21/02581* (2013.01)

(56) References Cited

U.S. PATENT DOCUMENTS

| | | |
|---|---|---|
| 2003/0012240 A1 | 1/2003 | Yamamoto et al. |
| 2003/0062517 A1 | 4/2003 | Ryder et al. |
| 2004/0048406 A1 | 3/2004 | Ikeda et al. |
| 2007/0091957 A1 | 4/2007 | Watatani |
| 2007/0104236 A1 | 5/2007 | Kobayashi |
| 2008/0240191 A1 | 10/2008 | Takada et al. |
| 2011/0164641 A1 | 7/2011 | Yoshida et al. |

FOREIGN PATENT DOCUMENTS

| | | |
|---|---|---|
| JP | 08-236859 A | 9/1996 |
| JP | 2000-174388 | 6/2000 |
| JP | 2000-174389 | 6/2000 |

FIG. 1A  COMPARATIVE EMBODIMENT
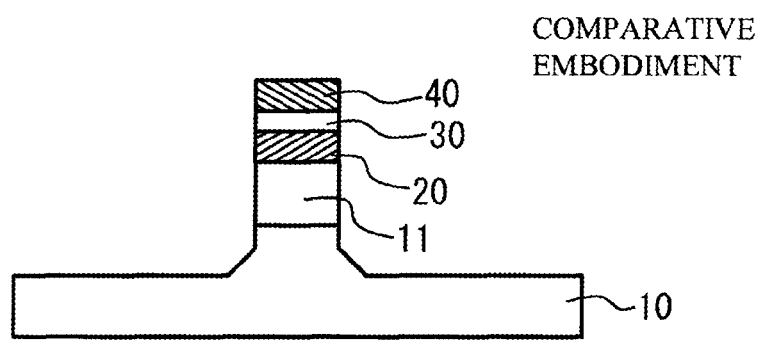
FIG. 1B
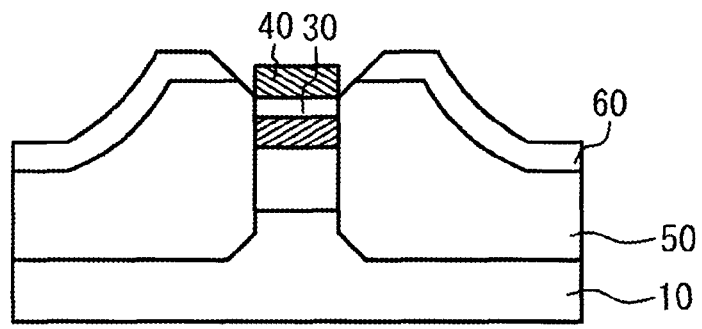
FIG. 1C
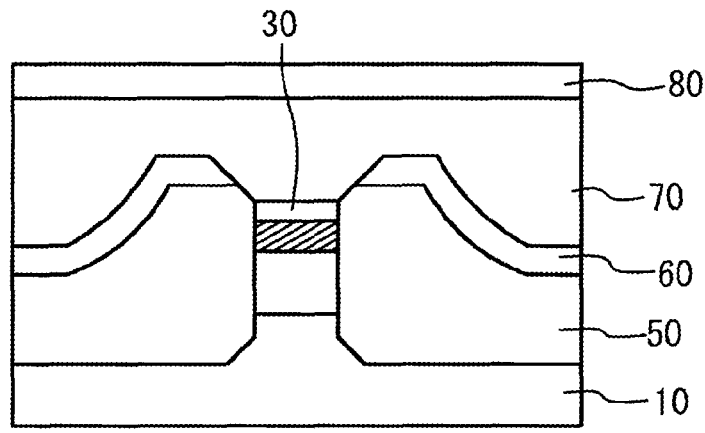
FIG. 1D
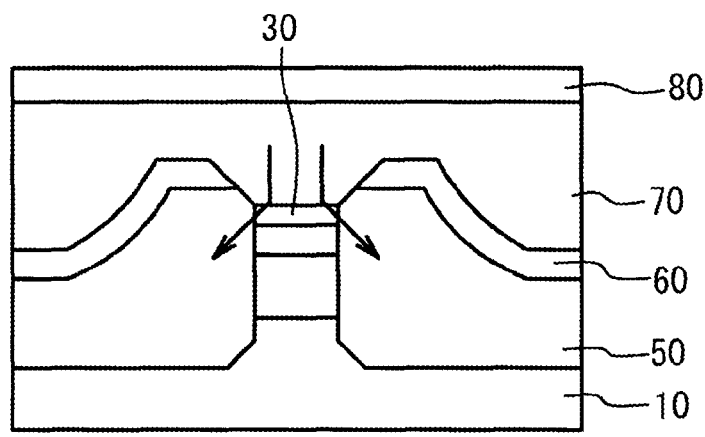

FIRST EMBODIMENT

OPTICAL SEMICONDUCTOR DEVICE AND METHOD OF MANUFACTURING OPTICAL SEMICONDUCTOR DEVICE

CROSS-REFERENCE TO RELATED APPLICATION

This application is a divisional of U.S. application Ser. No. 13/094,117, filed on Apr. 26, 2011, which is based upon and claims the benefit of priority of the prior Japanese Patent Application No. 2010-102729, filed on Apr. 27, 2010 and Japanese Patent Application No. 2011-057014, filed on Mar. 15, 2011, which are hereby incorporated by reference in their entirety.

BACKGROUND (i) Technical Field

The present invention relates to an optical semiconductor device and a method of manufacturing an optical semiconductor device.

(ii) Related Art

Japanese Patent Application Publication No. 2000-174389 discloses a semiconductor laser in which a p-type InP, an n-type InP and a p-type InP bury a mesa stripe including an active layer. The semiconductor laser may be manufactured through a process of burying the mesa stripe by laminating the p-type InP, the n-type InP and the p-type InP after forming the mesa stripe.

SUMMARY

It is effective to narrow a hole leak path, in order to reduce a threshold current of a semiconductor laser. In concrete, two ways of arranging an n-type InP burying layer closer to a p-type cladding layer and reducing a thickness of the p-type cladding layer are effective.

However, it is difficult to make a distance between the n-type InP burying layer and the p-type cladding layer constant in a wafer face, because of temperature distribution in the wafer face and a decomposition rate difference of material gas, and so on. This may result in variation of a narrowed width. A mask is formed on the p-type cladding layer when growing the burying layer selectively. The mask may cause a distortion of the active layer when the thickness of the p-type cladding layer is reduced. Therefore, the thickness of the p-type cladding layer must be larger. Accordingly, it is difficult to narrow the hole leak path.

It is an object of the present invention to provide an optical semiconductor device of which leak path is narrowed, and a method of manufacturing the optical semiconductor device.

According to an aspect of the present invention, there is provided a method of manufacturing an optical semiconductor device including: forming a mesa structure including a first conductivity type cladding layer, an active layer and a second conductivity type cladding layer in this order on a first conductivity type semiconductor substrate, an upper most surface of the mesa structure being constituted of an upper face of the second conductivity type cladding layer; growing a first burying layer burying both sides of the mesa structure at higher position than the active layer; forming a depressed face by etching both edges of the upper face of the second conductivity type cladding layer; and growing a second burying layer of the first conductivity type on the depressed face of the second conductivity type cladding layer and the first burying layer.

According to another aspect of the present invention, there is provided an optical semiconductor device including: a mesa structure having a first conductivity type cladding layer, an active layer and a second conductivity type cladding layer in this order on a first conductivity type semiconductor substrate; a first burying layer burying both sides of the mesa at higher position than the active layer; a depressed face provided at both edges of an upper face of the second conductivity type cladding layer; and a second burying layer provided on the depressed face and the first burying layer, the second burying layer being the first conductivity type.

BRIEF DESCRIPTION OF THE DRAWINGS

FIG. 1A through FIG. 1D illustrate a method of manufacturing a semiconductor laser in accordance with a comparative embodiment;

DETAILED DESCRIPTION

Figure 2A:
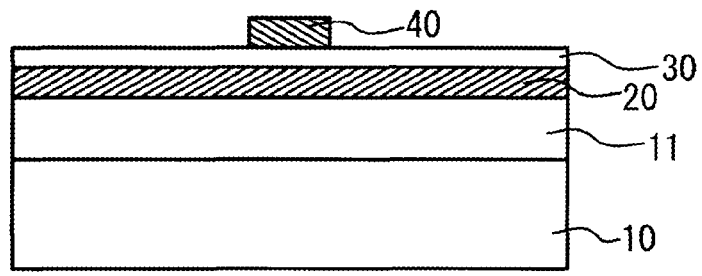
FIG. 2A through FIG. 2D illustrate a method of manufacturing a semiconductor laser in accordance with a first embodiment.

A description will be given of a best mode for carrying the present invention.
(Comparative Embodiment)

FIG. 1A through FIG. 1D illustrate a method of manufacturing a semiconductor laser in accordance with a comparative embodiment. As illustrated in FIG. 1A, a mesa stripe is formed on an n-type InP substrate 10. The mesa stripe has a structure in which an active layer 20 and a p-type cladding layer 30 are provided on an n-type cladding layer 11. A mask 40 made of $SiO_2$ is formed on the p-type cladding layer 30 of the mesa stripe.

Next, as illustrated in FIG. 1B, a first burying layer 50 and a second burying layer 60 are grown on the n-type InP substrate 10 in this order on both sides of the mesa stripe. In this case, the first burying layer 50 is grown so that an end of the first burying layer 50 on the side of the mesa stripe is higher than an upper face of the active layer 20. The first burying layer 50 is made of p-type semiconductor. The second burying layer 60 is made of n-type semiconductor.

Then, as illustrated in FIG. 1C, a third burying layer 70 made of p-type InP is grown so as to cover an upper face of the p-type cladding layer 30 and an upper face of the second burying layer 60, after removing the mask 40. The p-type cladding layer 30 and the third burying layer 70 act as a p-type cladding layer. A contact layer 80 made of InGaAs or the like is grown on the third burying layer 70. After that, a needed electrode is provided. With the processes, the semiconductor laser in accordance with the comparative embodiment is manufactured.

In the semiconductor laser in accordance with the comparative embodiment, an contact area between the p-type cladding layer 30, the third burying layer 70 and the first burying layer 50 gets larger. Therefore, an amount of hole leak from the p-type cladding layer 30 and the third burying layer 70 to the first burying layer 50 is enlarged. In this case, a threshold current is increased, and direct modulation property is degraded. So, the hole leak may be restrained by arranging the n-type InP burying layer 60 closer to the p-type cladding layer 30 and reducing a thickness of the p-type cladding layer 30.

However, it is difficult to keep a distance between the n-type InP burying layer 60 and the p-type cladding layer 30 constant in a wafer face, because of temperature distribution in the wafer face, a decomposition rate difference of raw material gas, or the like. This may result in variation of narrowed width. It is necessary to provide the mask 40 on the p-type cladding layer 30 in order to grow the first burying layer 50 and the second burying layer 60 on an area except for the mesa stripe. When the thickness of the p-type cladding layer 30 is reduced, the mask 40 causes a strain in the active layer 20. Therefore, the thickness of the p-type cladding layer 30 must be increased in the manufacturing method in accordance with the comparative embodiment. It is therefore difficult to narrow the hole leak path.

[First Embodiment]

A description will be given of a method of manufacturing a semiconductor laser in accordance with a first embodiment. FIG. 2A through FIG. 4 illustrate the method of manufacturing the semiconductor laser in accordance with the first embodiment. As illustrated in FIG. 2A, the n-type cladding layer 11, the active layer 20 and the p-type cladding layer 30 are grown on the n-type InP substrate 10. Next, the mask 40 is formed in a stripe shape on an area of the p-type cladding layer 30 where the mesa stripe is to be formed.

The n-type InP substrate 10 is, for example, made of n-type InP in which Sn (tin) of $1.0 \times 10^{18}/cm^3$ is doped. The n-type cladding layer 11 is, for example, made of n-type InP having a thickness of 0.5 μm in which Si (silicon) of $1.0 \times 10^{18}/cm^3$ is doped. For example, the active layer 20 has an InGaAsP-based multiple quantum well structure. The p-type cladding layer 30 is, for example, made of p-type InP having a thickness of 0.2 μm in which Zn (zinc) of $1.0 \times 10^{18}/cm^3$ is doped. For example, the mask 40 is made of $SiO_2$.

Figure 2B:
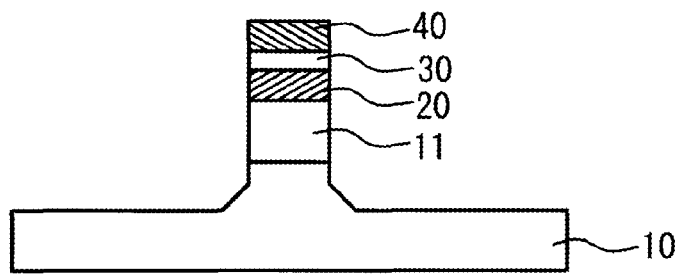

Next, as illustrated in FIG. 2B, the p-type cladding layer 30, the active layer 20 and the n-type cladding layer 11 are subjected to a dry etching process with use of the mask 40 as an etching mask. Thus, a mesa stripe is formed on the n-type InP substrate 10. For example, RIE (Reactive Ion Etching) method using $SiCl_4$ may be used as the dry etching process. A height of the mesa stripe without the mask 40 is, for example, 1.5 μm to 2.0 μm.

Figure 2C:
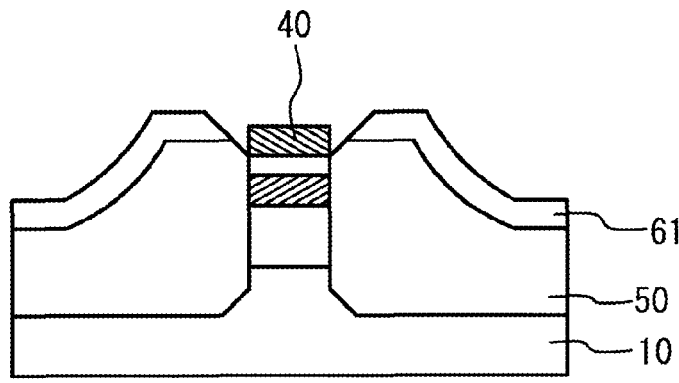

Then, as illustrated in FIG. 2C, the first burying layer 50 and the n-type burying layer 61 are grown on the n-type InP substrate 10 on both sides of the mesa stripe. In this case, the first burying layer 50 and the n-type burying layer 61 are selectively grown on an area except for the mask 40. The first burying layer 50 is grown so that an end of the first burying layer 50 on the side of the mesa stripe is higher than an upper face of the active layer 20. The first burying layer 50 is p-type semiconductor layer or highly-resistive semiconductor layer in which impurity (deep acceptor) such as Fe, Ti or Co generating deep acceptor level is doped. For example, the first burying layer 50 may be made of InP having a thickness of 1.3 μm in which Zn (Zinc) of $5.0 \times 10^{17}/cm^3$ is doped or made of InP having a thickness of 1.3 μm in which Fe (iron) of $7.0 \times 10^{16}/cm^3$ is doped. The n-type burying layer 61 is, for example, made of n-type InP having a thickness of 0.2 μm in which S (sulfur) of $1.0 \times 10^{19}/cm^3$ is doped.

Figure 2D:
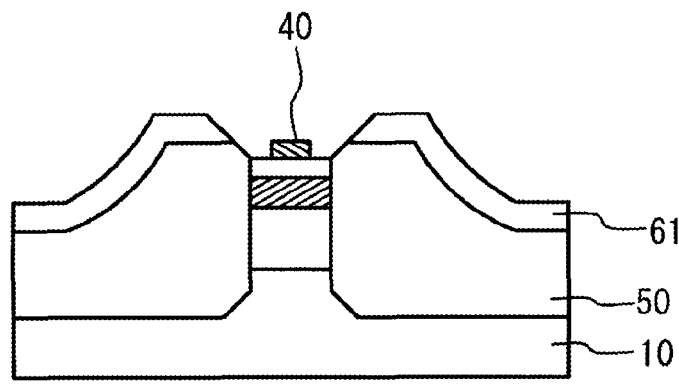

Next, as illustrated in FIG. 2D, the mask 40 is subjected to an etching process. Thus, the upper face of the mask 40, and both end portions of the mask 40 on the side of the first burying layer 50 is etched. Thus, both end portions of the p-type cladding layer 30 on the side of the first burying layer 50 are exposed. A BHF (Buffered Hydrofluoric Acid) may be used in the etching process of FIG. 2D.

Figure 3A:
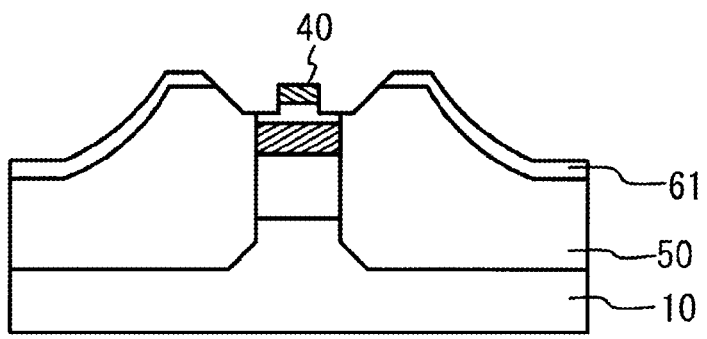
FIG. 3A through FIG. 3D illustrate the method of manufacturing the semiconductor laser in accordance with the first embodiment.

Then, as illustrated in FIG. 3A, the exposed face of the p-type cladding layer 30 is subjected to an etching process. In this case, a face lower than the upper face of the mesa stripe (depressed face) is formed on both sides of the mesa stripe. For example, the p-type cladding layer 30 has only to be etched by approximately 0.1 μm. A liquid ($NH_3$:$H_2O_2$ is 1:1) may be used as the etching liquid.

Figure 3B:
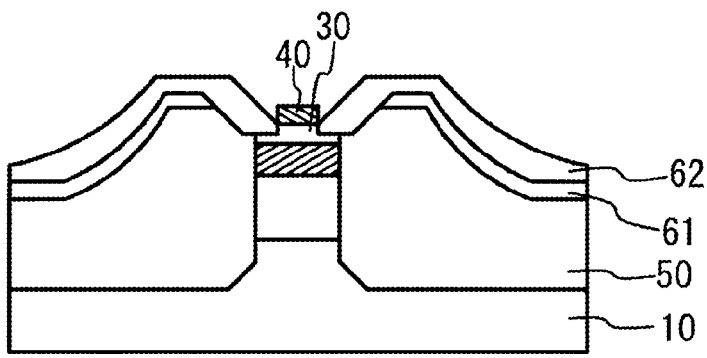

Next, as illustrated in FIG. 3B, an n-type burying layer 62 is grown so as to cover the area of the p-type cladding layer 30 removed through the etched area of the p-type cladding layer 30 and the n-type burying layer 61. The n-type burying layer 62 is, for example, made of the same material as the n-type burying layer 61. The n-type burying layer 62 is, for example, made of n-type InP having a thickness of 0.25 μm in which S (sulfur) of $1.0 \times 10^{19}/cm^3$ is doped.

Figure 3C:
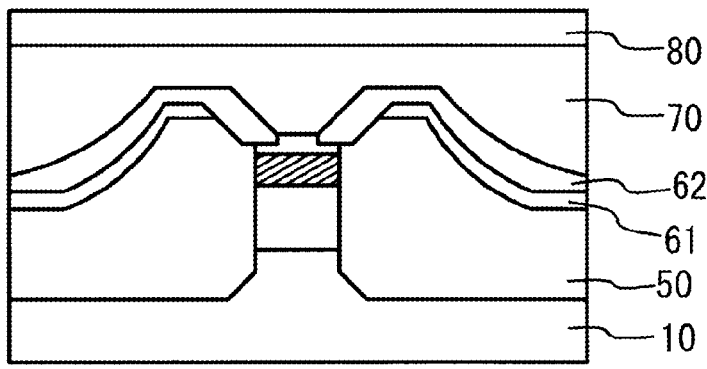
Figure 3D:
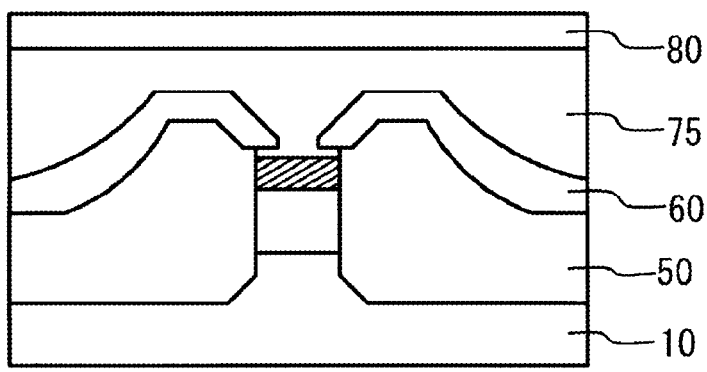

Then, as illustrated in FIG. 3C, the third burying layer 70 is grown so as to cover an upper face of the p-type cladding layer 30 and an upper face of the n-type burying layer 62. Further, a contact layer 80 is grown so as to cover an upper face of the third burying layer 70. The third burying layer 70 is made of p-type semiconductor. The third burying layer 70 is, for example, made of the same material as the p-type cladding layer 30. The third burying layer 70 is, for example, made of p-type InP having a thickness of 2.0 μm in which Zn (Zinc) of $1.2 \times 10^{18}/cm^3$ is doped. The contact layer 80 is made of a material having a band gap that is narrower than that of the third burying layer 70. The contact layer 80 is, for example, made of p-type InGaAs having a thickness of 0.5 μm in which Zn (zinc) of $1.5 \times 10^{19}/cm^3$ is doped. As illustrated in FIG. 3D, the p-type cladding layer 30 and the third burying layer 70 act as a p-type cladding layer 75. The n-type burying layer 61 and the n-type burying layer 62 act as the second burying layer 60.

Figure 4:
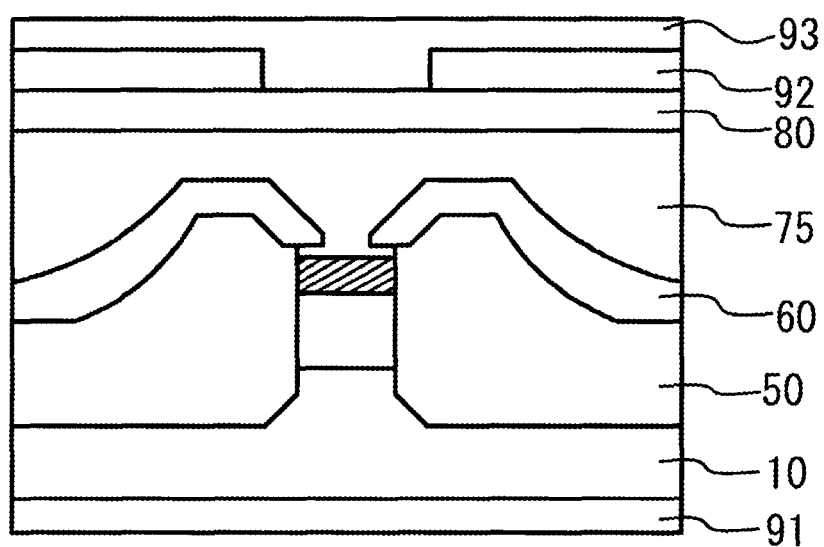
FIG. 4 illustrates the method of manufacturing the semiconductor laser in accordance with the first embodiment.

Next, as illustrated in FIG. 4, an n-type electrode 91 is formed on a bottom face of the n-type InP substrate 10. A passivation film 92 is formed on the contact layer 80 except for an area above the mesa stripe. And, a p-type electrode 93 is formed so as to cover the exposed area of the contact layer 80 and the passivation film 92. The n-type electrode 91 is, for example, made of AuGeNi. The passivation film 92 is made of an insulating material such as $SiO_2$. The p-type electrode 93 is, for example, made of TiPtAu.

With the processes, a semiconductor laser 100 is manufactured. A MOVPE (Metal Organic Vapor Phase Epitaxy) method may be used when growing above-mentioned semiconductor layers. Growth temperature in the MOVPE method may be approximately 600 degrees C. The InP is made from trimethyl indium and phosphine. Dimethyl zinc may be used for when doping Zn (zinc). Ferrocene may be used for when doping Fe (iron). Hydrogen sulfide may be used for when doping S (sulfur). Disilane may be used for when doping Si (silicon).

In the embodiment, the processes of FIG. 2D and FIG. 3A are performed after growing the n-type burying layer 61. However, the manufacturing method is not limited to the embodiment. For example, in the process of FIG. 2C, the n-type burying layer 61 may not be grown. The second burying layer 60 may be grown after the etching process of FIG. 3A.

Figure 5:
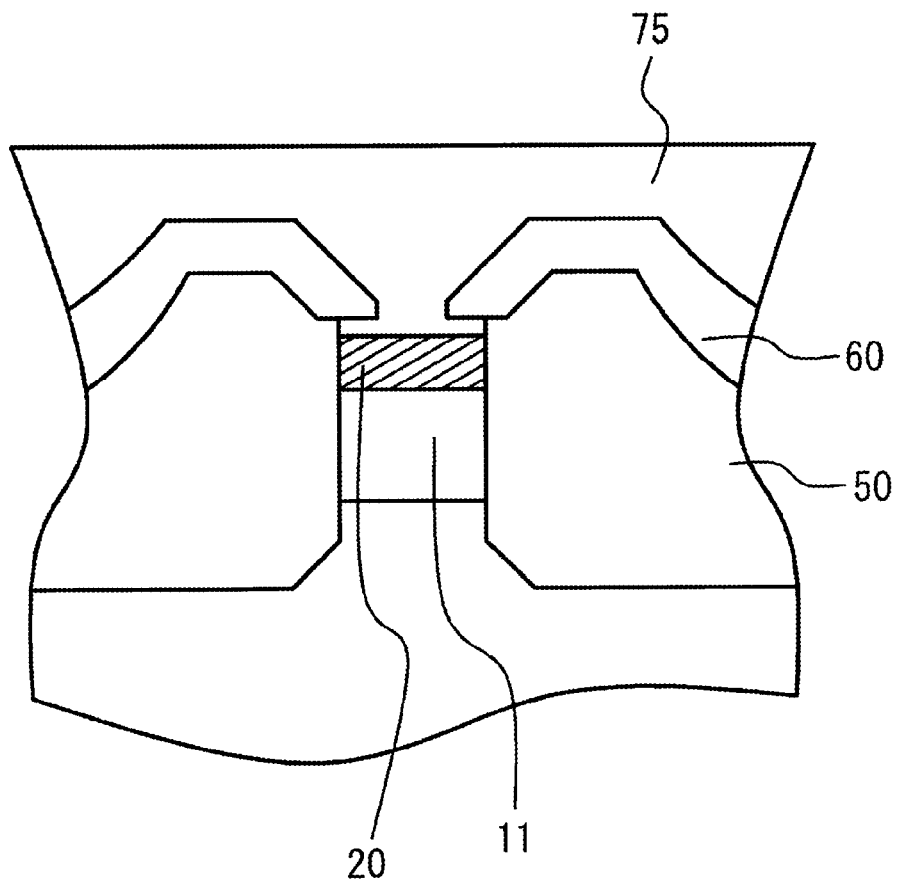
FIG. 5 illustrates an enlarged view of a mesa stripe.

FIG. 5 illustrates an enlarged view around of the mesa stripe. As illustrated in FIG. 5, a thickness of a part contacting area of the p-type cladding layer 75 with the first burying layer 50 is reduced through the etching process. Thus, the hole leak path is narrowed. Therefore, the threshold current is reduced, and the direct modulation property is improved. The thickness of the contacting area is controlled better in the etching process than in the growth method. Thus, the thickness variation of the contacting area in a wafer face may be restrained. Therefore, variation of the narrowed width is restrained. And, the distortion of the active layer 20 caused by the mask 40 is restrained because the area of the p-type cladding layer 30 on where the mask 40 is provided is relatively thick.

Figure 6:
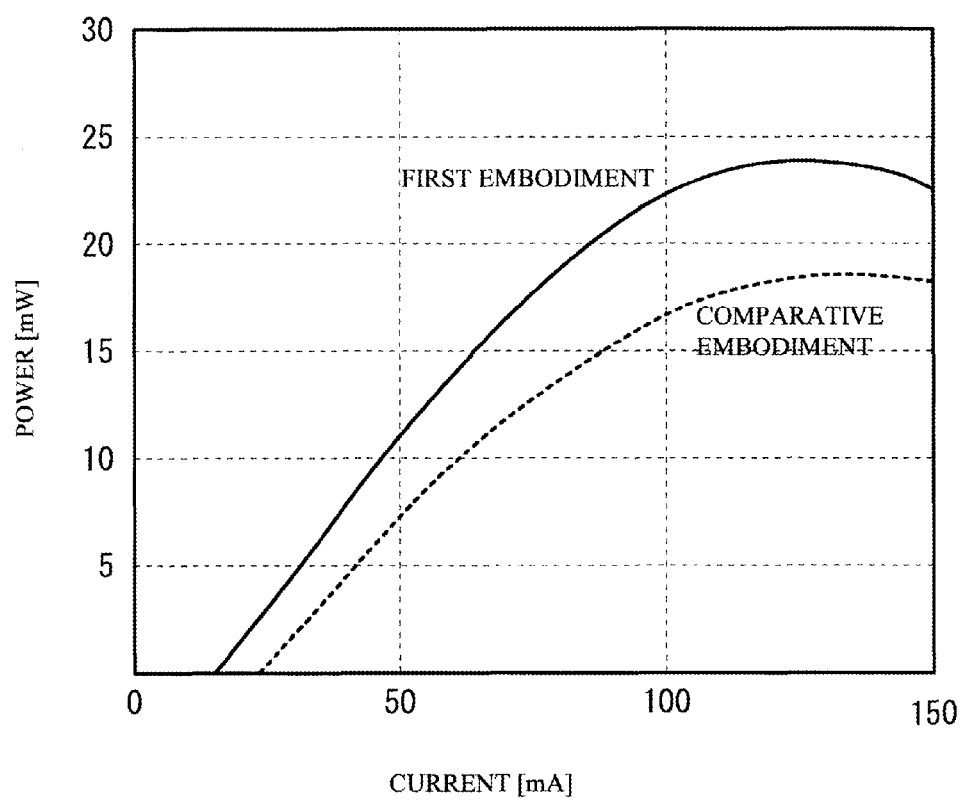
FIG. 6 illustrates current characteristics of a semiconductor laser.

FIG. 6 illustrates current characteristics of the semiconductor laser. In FIG. 6, a horizontal axis indicates a current provided to the semiconductor laser, and a vertical axis indicates an outputting power of the semiconductor laser. FIG. 6 illustrates the current characteristics of the semiconductor laser 100 in accordance with the first embodiment and the semiconductor laser in accordance with the comparative embodiment. An element length L is 200 µm. A measuring temperature is 75 degrees C.

As illustrated in FIG. 6, the threshold current of the semiconductor laser 100 was lower than that of the semiconductor laser in accordance with the comparative embodiment. The outputting power of the semiconductor laser 100 was higher than that of the semiconductor laser in accordance with the comparative embodiment. This is because the hole leak path is narrowed in the semiconductor laser 100.

[Second Embodiment]

Figure 7A:
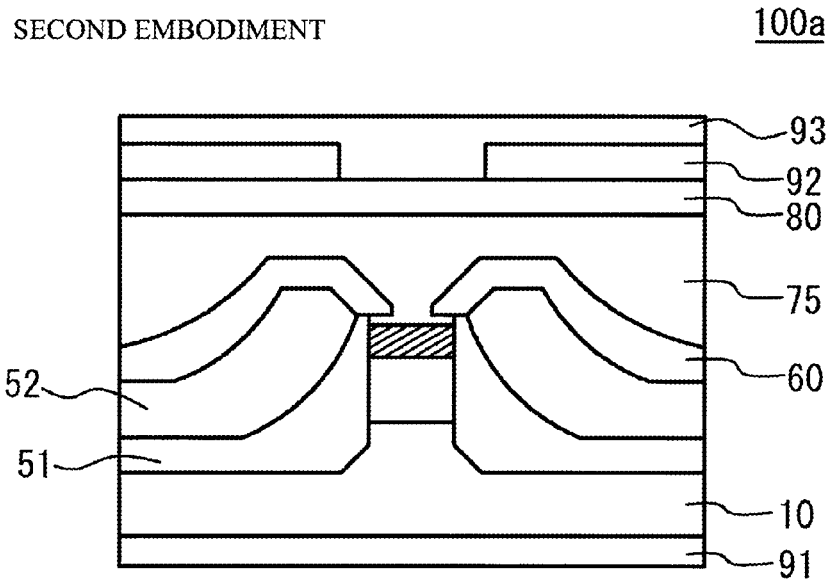
FIG. 7A illustrates a schematic cross sectional view of a semiconductor laser in accordance with a second embodiment.

The first burying layer 50 may have a structure in which a highly resistive semiconductor layer and a p-type semiconductor layer are laminated. FIG. 7A illustrates a schematic cross sectional view of a semiconductor laser 100a in accordance with a second embodiment. The semiconductor laser 100a is different from the semiconductor laser 100 of FIG. 4 in a point that a burying layer in which a highly resistive semiconductor layer 52 is laminated on a p-type semiconductor layer 51 is provided instead of the first burying layer 50. Impurity such as Fe, Ti or Co generating deep acceptor level is doped in the highly resistive semiconductor layer 52. With the structure, an element capacity may be reduced more, compared to a case where a p-type InP is used as the first burying layer 50. Thus, the frequency characteristics of the semiconductor laser 100a are improved.

Figure 7B:
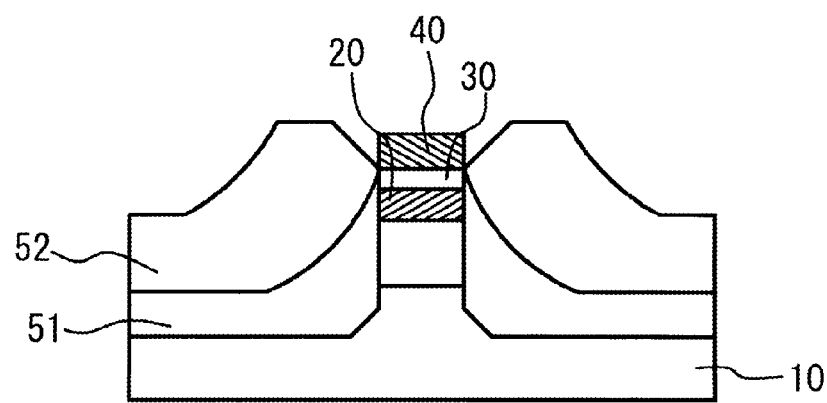
FIG. 7B illustrates a method of manufacturing the semiconductor laser in accordance with the second embodiment.

FIG. 7B illustrates a method of manufacturing the semiconductor laser 100a. As illustrated in FIG. 7B, instead of the first burying layer 50, the p-type semiconductor layer 51 and the highly resistive semiconductor layer 52 are grown in this order on the n-type InP substrate 10 in the process of FIG. 2C when manufacturing the semiconductor laser 100a. In this case, the highly resistive semiconductor layer 52 is grown so that an end of the p-type semiconductor layer 51 on the side of the mesa stripe is higher than the upper face of the active layer 20. The p-type semiconductor layer 51 is, for example, made of InP having a thickness of 0.5 µm in which Zn of $5.0 \times 10^{17}/cm^3$ is doped. The highly resistive semiconductor layer 52 is, for example, made of InP having a thickness of 0.7 µm in which Fe (iron) of $7.0 \times 10^{16}/cm^3$ is doped.

A MOVPE (Metal Organic Vapor Phase Epitaxy) method may be used when growing the p-type semiconductor layer 51 and the highly resistive semiconductor layer 52. Growth temperature in the MOVPE method may be approximately 600 degrees C. The InP is made from trimethyl indium and phosphine. Dimethyl zinc may be used for when doping Zn (zinc). Ferrocene may be used for when doping Fe (iron).

[Third Embodiment]

Figure 8:
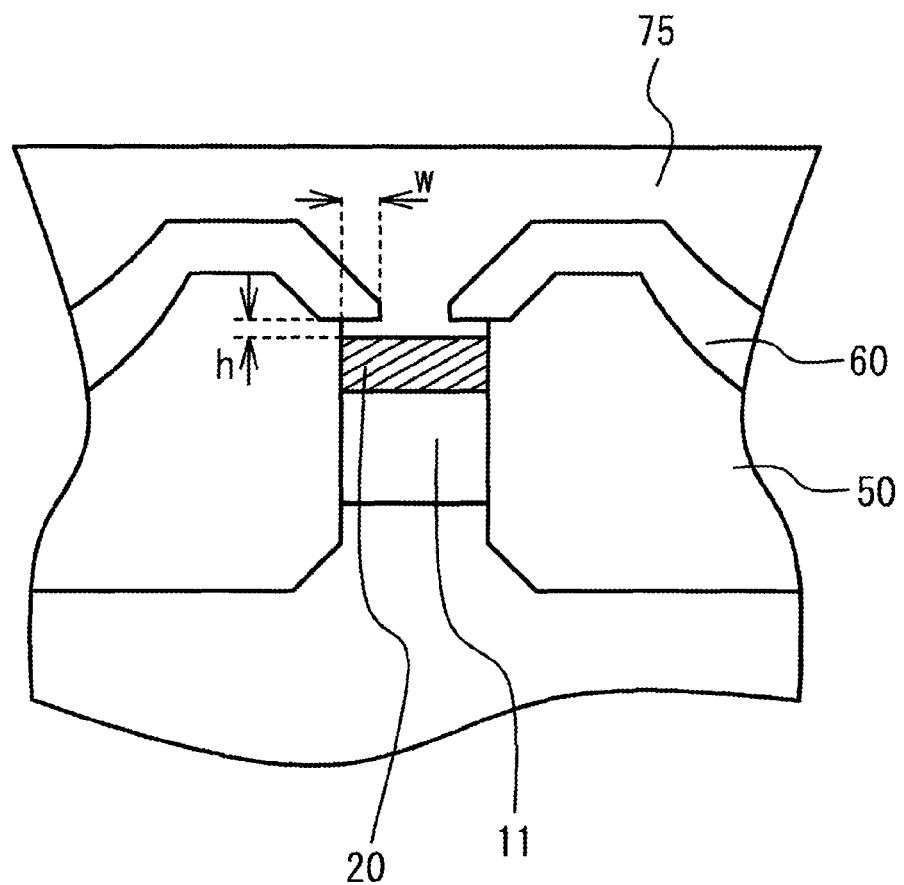
FIG. 8 illustrates a schematic cross sectional view of a semiconductor laser in accordance with a third embodiment.

FIG. 8 illustrates a schematic cross sectional view of a semiconductor layer 100b in accordance with a third embodiment. The same components as those illustrated in FIG. 8 have the same reference numerals as FIG. 4. In the embodiment, "W" and "h" of a region between the active layer 20 and the second burying layer 60 are researched. The "h" is a height from the active layer 20 to a lower face of the second burying layer 60 formed in the process of FIG. 3A. The "W" is a width of the depressed face of the second burying layer 60 above the active layer 20.

Samples 1 to 3 of Table 1 were manufactured having a different combination of "W" and "h".

TABLE 1

|  | HEIGHT h (nm) | WIDTH W (nm) | W/h |
|---|---|---|---|
| SAMPLE 1 | 120 | 200 | 1.7 |
| SAMPLE 2 | 100 | 200 | 2.0 |
| SAMPEL 3 | 80 | 160 | 2.0 |

Figure 9:
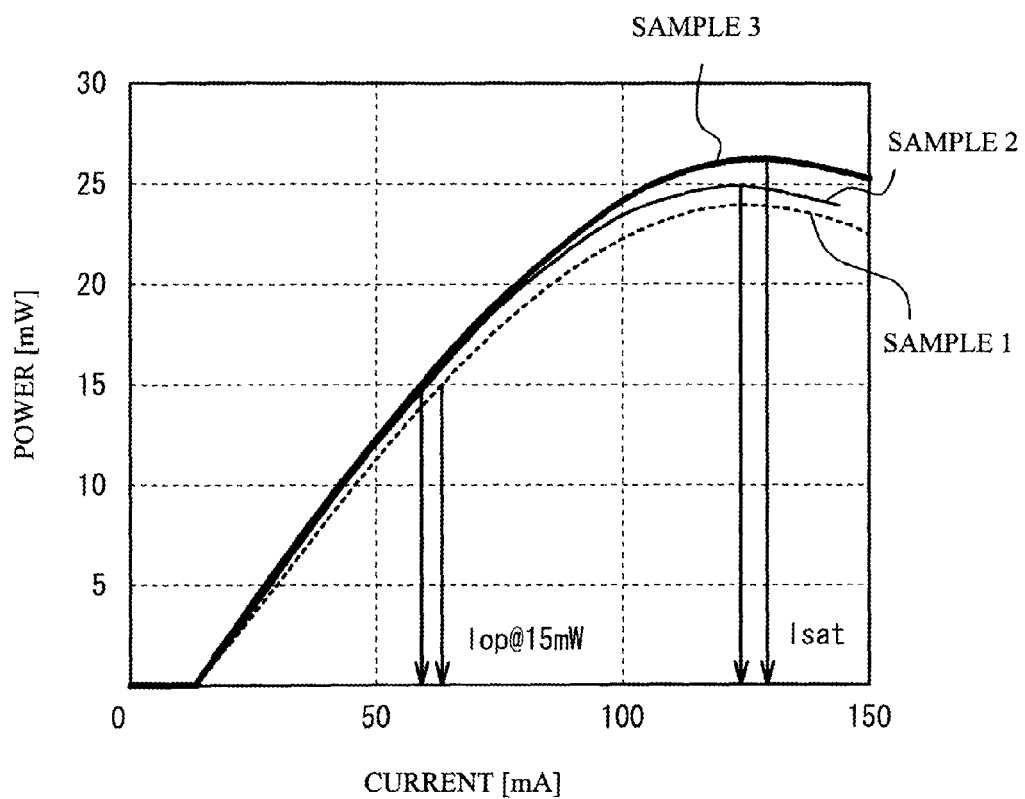
FIG. 9 illustrates current characteristics of a semiconductor laser.

FIG. 9 illustrates the current characteristics of the samples 1 to 3 of the semiconductor laser 100b. In FIG. 9, a horizontal axis indicates a current provided to the semiconductor lasers, and a vertical axis indicates outputting power of the semiconductor lasers. An element length L is 200 µm. A measuring temperature is 75 degrees C. The width of the active layer 20 is 1.2 µm. As illustrated in FIG. 9, an operating current Iop @ 15 mW of the samples 2 and 3 at an outputting power of 15 mW is lower than the sample 1. This means that the rising efficiency or slope efficiency (mW/mA) is increased, compared to the sample 1.

In the sample 3, the "W" is reduced further than in the sample 2, and the "h" is smaller than in the sample 2. The amount of hole leak has a correlation with the region defined by the "h" and the "W". Increasing of the resistance value of the region may cause the reduction of the hole leak. The resistance value of the area defined by the "W" and the "h" is the same in the samples 2 and 3. However, in accordance with FIG. 9, a maximum optical outputting power of the sample 3 is larger than that of the sample 2. This is because the reduction of the "W" causes a reduction of an area shaded by the first burying layer 60 over the active layer 20. That is, the reduction of the "W" causes an enlargement of a hole current clearance Wp with respect to the active layer 20. Thus, conductance of the hole current is increased. The clearance Wp is defined with the second burying layer 60 formed on both sides of the mesa stripe.

According to the research with the samples 1 to 3, it is preferable that the "h" is reduced in order to reduce the hole leak. And, it is preferable that the "W" is optimally defined with the correlation between the hole leak and the hole conductance with respect to the active layer 20. The present inventors have confirmed that it is preferable that the "h" is preferably 100 nm or less, 1.8≤W/h, and the "Wp" is 500 nm or more. It is more preferable that the "h" is 80 nm or less.

In the above mentioned embodiments, an active layer is provided on an n-type cladding layer, and a p-type cladding layer is provided on the active layer. However, the structure is not limited to the embodiments. For example, the p-type cladding layer, the active layer and the n-type cladding layer are provided in this order on a p-type semiconductor substrate.

In the above-mentioned embodiments, the semiconductor laser is used as one example of an optical semiconductor device of the present invention. However, the optical semiconductor device is not limited to the semiconductor laser. For example, another optical semiconductor device such as a semiconductor optical amplifier (SOA) is used as the optical semiconductor device.

The present invention is not limited to the specifically disclosed embodiments and variations but may include other embodiments and variations without departing from the scope of the present invention.

What is claimed is:

1. A method of manufacturing an optical semiconductor device comprising:

forming a mesa structure including a first conductivity type cladding layer, an active layer and a second conductivity type cladding layer in this order on a first conductivity type semiconductor substrate, an upper most surface of the mesa structure being constituted of an upper face of the second conductivity type cladding layer;

growing a first burying layer burying both sides of the mesa structure at higher position than the active layer;

forming a depressed face by etching both edges of the upper face of the second conductivity type cladding layer so that the depressed face of the second conductivity type cladding layer is parallel to an upper face of the active layer; and growing a second burying layer of the first conductivity type on the depressed face of the second conductivity type cladding layer and the first burying layer so that a shortest distance area between the active layer and the second burying layer being the depressed part of the second conductivity type cladding layer, being substantially rectangular and being located on an upside of the active layer.

2. The method as claimed in claim 1, wherein the first burying layer is formed by a selective growing process using a selective growing mask formed on the upper face of the second conductivity type cladding layer, the depressed face being formed by a selective etching process using a selective etching mask, the selective etching mask being consisted of the selective growing mask which offsets both edges.

3. The method as claimed in claim 1, wherein the first burying layer is a highly resistive semiconductor layer doped with a deep acceptor.

4. The method as claimed in claim 3, wherein the deep acceptor is one of Fe, Ti or Co.

5. The method as claimed in claim 1, wherein the first burying layer is a semiconductor layer of the second conductivity type.

6. The method as claimed in claim 1, wherein the first burying layer has a structure in which a semiconductor layer of the second conductivity type and a highly resistive semiconductor layer doped with a deep acceptor are formed in this order.

7. The method as claimed in claim 6, wherein the deep acceptor is one of Fe, Ti or Co.

8. The method as claimed in claim 1, wherein a semiconductor layer of the first conductivity type is further provided on a top face of the first burying layer.

9. The method as claimed in claim 1 further comprising a growing process of a third burying layer and a contact layer on an upper face of the second burying layer and the upper face of the mesa structure, the third burying layer being the second conductivity type, the contact layer having a band gap narrower than the third burying layer.

10. A method of manufacturing an optical semiconductor device, comprising:

forming a mesa structure including a first conductivity type cladding layer, an active layer and a second conductivity type cladding layer in this order on a first conductivity type semiconductor substrate, an upper most surface of the mesa structure being constituted of an upper face of the second conductivity type cladding layer;

growing a first burying layer burying both sides of the mesa structure at higher position than the active layer;

forming an depressed face by etching both edges of the upper face of the second conductivity type cladding layer; and growing a second burying layer of the first conductivity type on the depressed face of the second conductivity type cladding layer and the first burying layer, wherein:

a height "h" of a distance from the active layer to the depressed face of the mesa structure is 100 nm or less;

a width "W" of the depressed face of the mesa structure have a relation of $W/h \geq 1.8$; and a width of the upper face of the mesa structure is 500 nm or more.

11. The method as claimed in claim 10, wherein:
the height "h" is 80 nm or less.

* * * * *